(12) United States Patent
Tarui et al.

(10) Patent No.: US 8,932,944 B2
(45) Date of Patent: Jan. 13, 2015

(54) SILICON CARBIDE SEMICONDUCTOR DEVICE MANUFACTURING METHOD

(71) Applicant: Mitsubishi Electric Corporation, Chiyoda-ku (JP)

(72) Inventors: Yoichiro Tarui, Tokyo (JP); Naoto Kaguchi, Tokyo (JP); Takuyo Nakamura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 13/950,044

(22) Filed: Jul. 24, 2013

(65) Prior Publication Data

US 2013/0309851 A1    Nov. 21, 2013

Related U.S. Application Data

(62) Division of application No. 13/252,565, filed on Oct. 4, 2011, now Pat. No. 8,525,189.

(30) Foreign Application Priority Data

Nov. 26, 2010  (JP) ................................. 2010-263199
Jul. 25, 2011  (JP) ................................. 2011-161585

(51) Int. Cl.
  *H01L 21/265*  (2006.01)
  *H01L 21/00*  (2006.01)
  (Continued)

(52) U.S. Cl.
  CPC .......... *H01L 29/1608* (2013.01); *H01L 21/046* (2013.01); *H01L 29/0615* (2013.01);
  (Continued)

(58) Field of Classification Search
  CPC ............ H01L 29/0615; H01L 29/0619; H01L 29/7811; H01L 29/1608; H01L 29/66068; H01L 29/1095; H01L 21/046; H01L 21/18; H01L 21/0415

USPC .......................... 438/514, 518, 285, 795, 931
  See application file for complete search history.

(56) References Cited

U.S. PATENT DOCUMENTS

2006/0255423 A1    11/2006    Ryu et al.
2007/0246791 A1    10/2007    Schulze et al.
(Continued)

FOREIGN PATENT DOCUMENTS

CN    101223647 A    7/2008
CN    201163629 Y    12/2008
(Continued)

OTHER PUBLICATIONS

Heera et al., "Phase formation due to high dose aluminum implantation into silicon carbide", 2000, Journal of Applied Physics, vol. 87, No. 1, pp. 78-85, Jan. 1, 2000.*

(Continued)

*Primary Examiner* — Nikolay Yushin
(74) *Attorney, Agent, or Firm* — Oblon, Spivak, McClelland, Maier & Neustadt, L.L.P.

(57) ABSTRACT

In the manufacture of a silicon carbide semiconductor device having a termination region being a JTE region or FLR, the margin of the amount of etching for removing a damage layer formed in the surface of the termination region is enlarged. A silicon carbide semiconductor device has a termination region being a JTE (Junction Termination Extension) region or an FLR (Field Limiting Ring) at a termination of the semiconductor elements. The termination region is formed by one step of ion implantation in which the kind of impurity and the implant energy are fixed. In the impurity concentration profile of the termination region in the depth direction, the concentration peak in the shallowest position is in a position deeper than 0.35 μm from the surface, and the concentration in the surface portion is not more than one-tenth of the shallowest concentration peak.

9 Claims, 9 Drawing Sheets

CELL

TERMINATION

(51) Int. Cl.

| | | |
|---|---|---|
| *H01L 29/16* | (2006.01) | |
| *H01L 21/04* | (2006.01) | |
| *H01L 29/06* | (2006.01) | |
| *H01L 29/10* | (2006.01) | |
| *H01L 29/66* | (2006.01) | |
| *H01L 29/78* | (2006.01) | |

(52) U.S. Cl.
CPC ........ *H01L29/0619* (2013.01); *H01L 29/1095* (2013.01); *H01L 29/66068* (2013.01); *H01L 29/7811* (2013.01)
USPC .......................................... 438/518; 438/796

(56) References Cited

U.S. PATENT DOCUMENTS

| | | | |
|---|---|---|---|
| 2009/0261348 | A1 | 10/2009 | Tarui et al. |
| 2010/0032685 | A1 | 2/2010 | Zhang et al. |
| 2010/0200931 | A1 | 8/2010 | Matocha et al. |
| 2010/0289032 | A1 | 11/2010 | Zhang et al. |
| 2010/0314629 | A1 | 12/2010 | Tarui et al. |
| 2011/0215338 | A1* | 9/2011 | Zhang .............................. 257/73 |

FOREIGN PATENT DOCUMENTS

| | | |
|---|---|---|
| JP | 2001-332508 | 11/2001 |
| JP | 2005-136092 | 5/2005 |
| JP | 2005-142288 | 6/2005 |
| JP | 2005-303010 | 10/2005 |
| JP | 2009/38356 | 2/2009 |
| JP | 2010-45363 | 2/2010 |
| WO | WO 2007/029375 | 3/2007 |
| WO | WO 2009/099182 A1 | 8/2009 |
| WO | WO 2010/134344 A1 | 11/2010 |

OTHER PUBLICATIONS

Office Action issued Dec. 3, 2013 in Korean Patent Application No. 10-2013-0135434 (with partial English language translation).

B. Jayant Baliga, "Power Semiconductor Devices; Chapter 3: Breakdown Voltage", Power Semiconductor Devices, PWS Publishing Company, 1995, 4 Pages.

Office Action issued on Feb. 22, 2013, in Korean Patent Application No. 10-2011-0115592 with partial English translation.

Office Action issued Oct. 14, 2014 in Japanese patent Application No. 2011-161585 (with English translation).

* cited by examiner

CELL

TERMINATION

F I G . 2
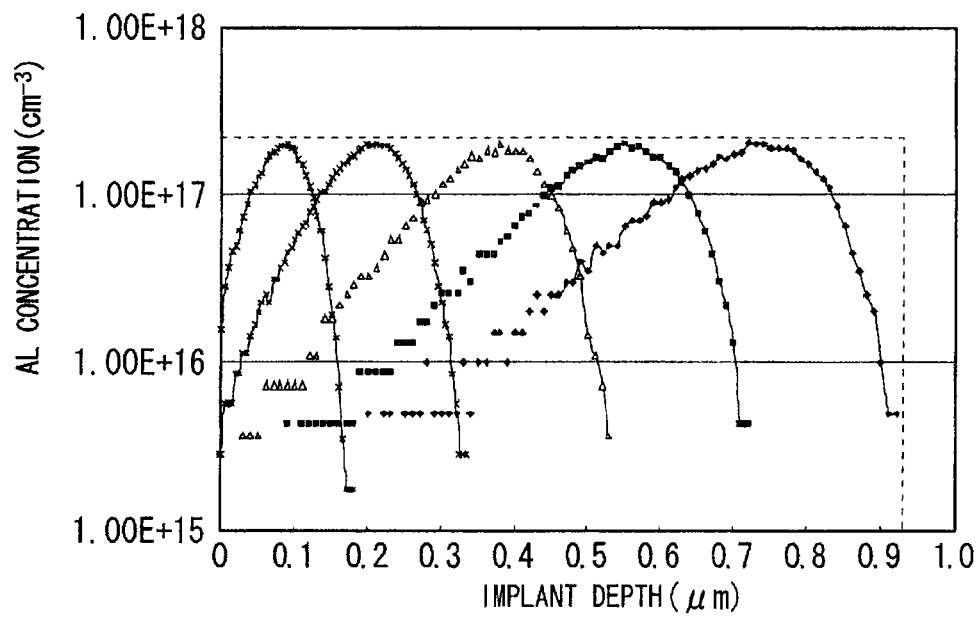
F I G . 3
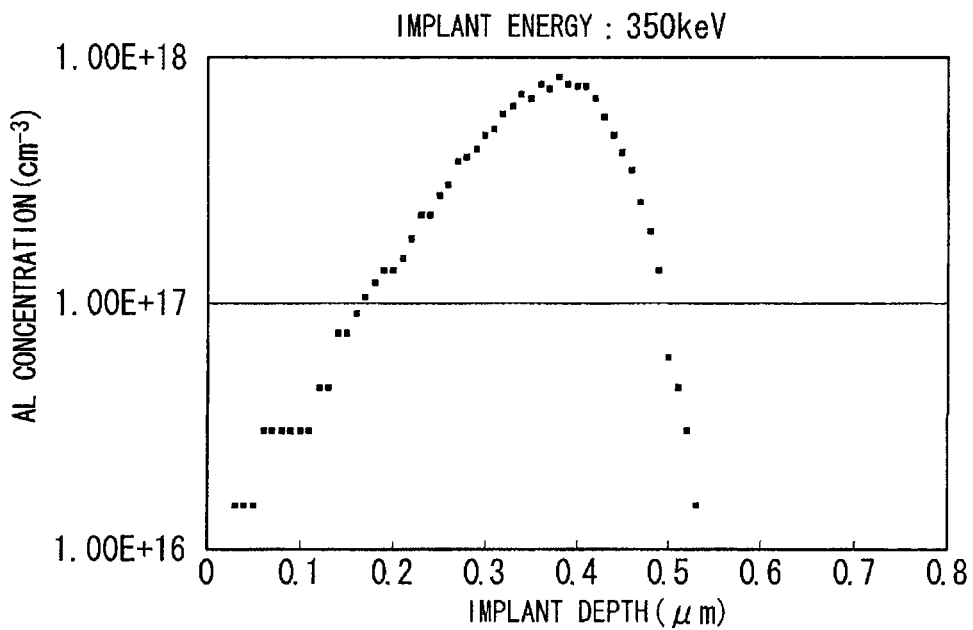

F I G . 4
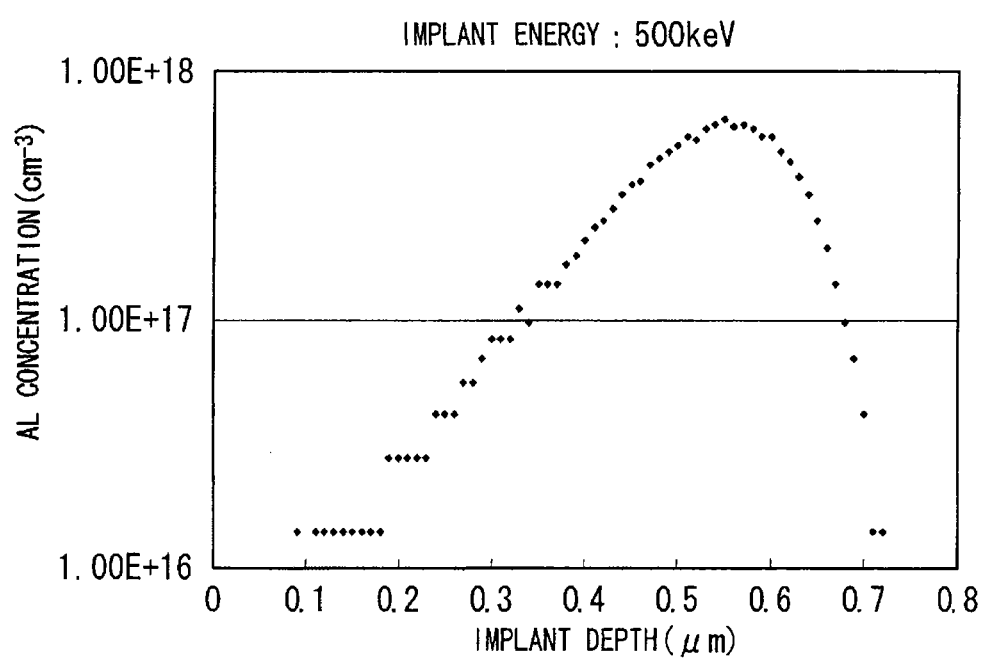

F I G. 5 A
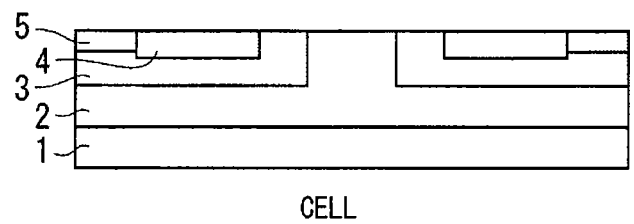
CELL
F I G. 5 B
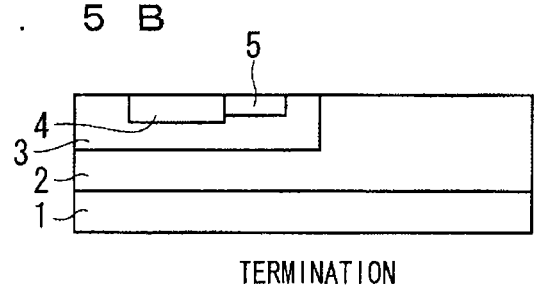
TERMINATION
F I G. 6 A
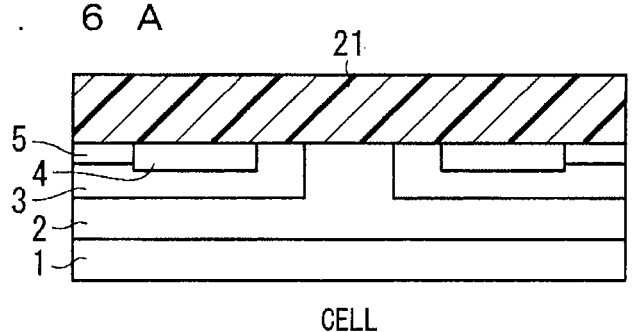
CELL
F I G. 6 B
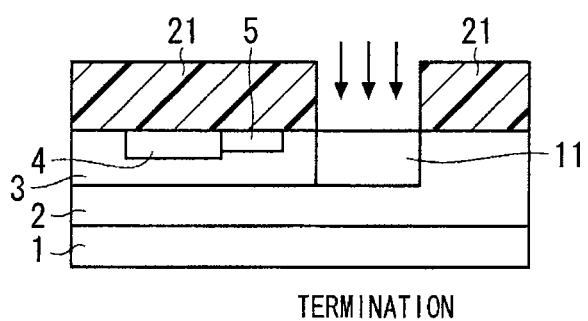
TERMINATION

CELL

TERMINATION

CELL

TERMINATION

F I G. 9 A
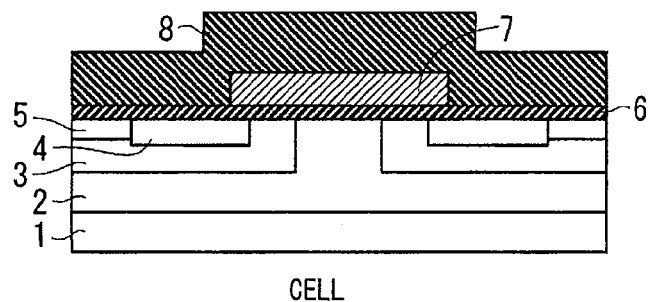
CELL
F I G. 9 B
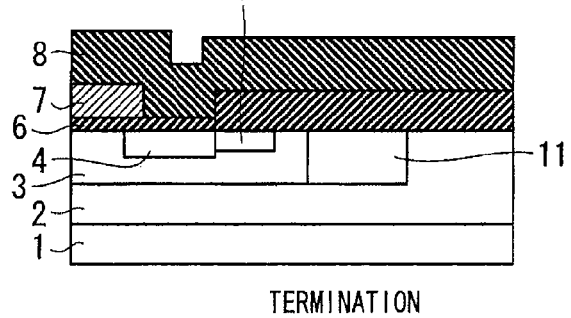
TERMINATION
F I G. 1 0 A
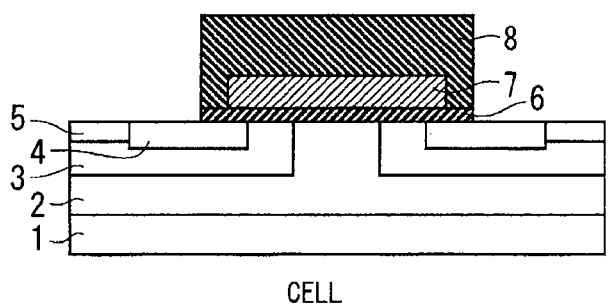
CELL
F I G. 1 0 B
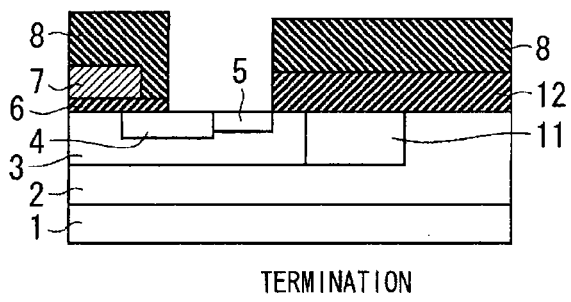
TERMINATION FIG. 11
| | THE AMOUNT OF ETCHING OF JTE REGION SURFACE | | | |
|---|---|---|---|---|
| | ZERO | 0.1 μm | 0.2 μm | 0.3 μm |
| Box IMPLANT | 1000V OR MORE | 1600V OR MORE | 1500V OR MORE | 1200V OR MORE |
| 350keV | 1600V OR MORE | 1500V OR MORE | 1100V OR MORE | 600V OR MORE |
| 500keV | 1600V OR MORE | 1600V OR MORE | 1500V OR MORE | 1200V OR MORE |
FIG. 12A
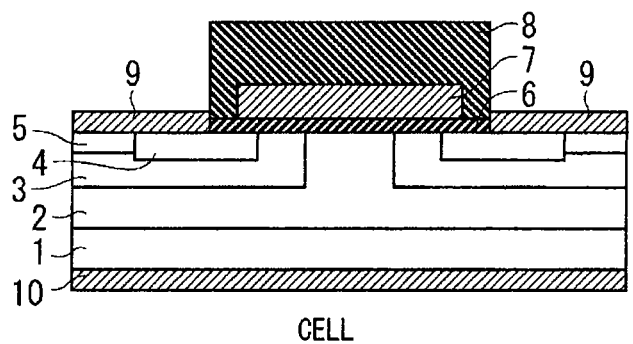
CELL
FIG. 12B
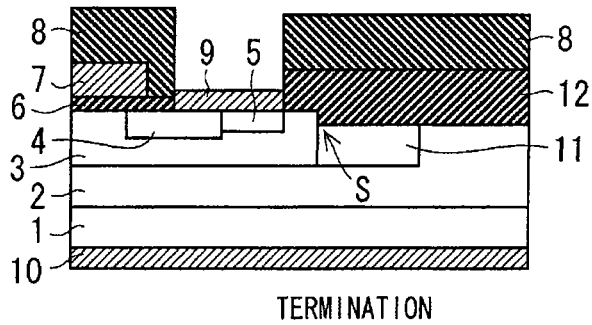
TERMINATION

TERMINATION

TERMINATION

TERMINATION

SILICON CARBIDE SEMICONDUCTOR DEVICE MANUFACTURING METHOD

CROSS-REFERENCE TO RELATED APPLICATIONS

This application is a divisional of U.S. application Ser. No. 13/252,565 filed Oct. 4, 2011, which is based upon and claims the benefit of priority from prior Japanese Patent Application Nos. 2010-263199, filed Nov. 26, 2010 and 2011-161585, filed Jul. 25, 2011, the entire contents of each of which are incorporated herein by reference.

BACKGROUND OF THE INVENTION

1. Field of the Invention

The present invention relates to silicon carbide semiconductor devices, and particularly to a termination structure including a junction termination extension (JTE) or a field limiting ring (FLR) for semiconductor elements.

2. Description of the Background Art

Semiconductor devices using silicon carbide (SiC) (MOSFETs (Metal oxide semiconductor field effect transistors), IGBTs (Insulated Gate Bipolar Transistors) etc.) are holding great promise as next-generation switching elements realizing high withstand voltage, low loss and high heat resistance, and they are expected for applications to power semiconductor devices such as inverters. Also, as a characteristic of SiC, it is known that the diffusion coefficients of impurities are very small, and ion-implanted impurities hardly diffuse even when thermally processed, and the impurity concentration profile immediately after the ion implantation is almost maintained.

Termination structures provided in the periphery (termination) of semiconductor elements include the JTE (Junction Termination Extension; for example, see B. Jayant Baliga "Power Semiconductor Devices" PWS Publishing Company, 1995, pp.111-113.) The JTE alleviates the electric field strength at the termination of semiconductor elements and improves the withstand voltage of the elements. In conventional SiC semiconductor device manufacturing methods, the ion implantation for the formation of the JTE region is carried out in multiple stages with varying implant energies (see FIG. 2). This is for the purpose of forming a JTE region with a Box type impurity concentration profile in SiC where impurity is not likely to diffuse.

After the formation of the JTE region by ion implantation, activation annealing is needed to activate the impurity; during the activation annealing, a damage layer is formed in the surface of the JTE region. Accordingly, after the activation annealing, the damage layer must be removed by sacrificial oxidation or dry etching. Accordingly, the JTE region has to be formed such that the designed withstand voltage is obtained after the surface damage layer has been removed.

Thus, the JTE region has to be formed such that a desired withstand voltage is obtained after the surface damage layer formed by activation annealing has been removed. In other words, the amount of removal of the surface of the JTE region must be determined such that the desired withstand voltage is obtained. In conventional SiC semiconductor device manufacturing methods, the margin of the amount of etching of the JTE region surface (the range of the amount of etching in which a desired withstand voltage is obtained) was small, and highly precise control of the amount of etching was needed in order to obtain the desired withstand voltage.

SUMMARY OF THE INVENTION

An object of the present invention is, in the manufacture of a silicon carbide semiconductor device having at least one of a JTE region and an FLR, to enlarge the margin of the amount of etching for removing a damage layer formed in the surface of termination region including at least one of the JTE region and FLR.

A silicon carbide semiconductor device according to the present invention includes a semiconductor element formed in a silicon carbide semiconductor layer, and a termination region being an impurity diffusion layer formed at a termination of the semiconductor element. The impurity diffusion layer includes at least one of a JTE region and an FLR. In an impurity concentration profile of the JTE region in a depth direction, a concentration peak in a shallowest position is in a position deeper than 0.35 μm from a surface.

A silicon carbide semiconductor device manufacturing method according to the present invention includes the steps of forming a given semiconductor element in a silicon carbide semiconductor layer, and forming a termination region including at least one of a JTE region and an FLR by impurity ion implantation in a surface portion of the silicon carbide semiconductor layer in a periphery of the semiconductor element. The impurity ion implantation is performed at such an implant energy that an impurity concentration peak is in a position deeper than 0.35 μm from a surface of the silicon carbide semiconductor layer. The impurity concentration in the vicinity of the surface of the termination region is lower, which suppresses the variation of the withstand voltage caused by the etching for removing the damage layer formed in the surface of the termination region. Accordingly, the margin of the amount of the etching can be enlarged.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram illustrating an impurity concentration profile of a JTE region in a conventional SiC semiconductor device;

FIG. 3 is a diagram showing an example of an impurity concentration profile of a JTE region in an SiC semiconductor device according to the first preferred embodiment of the present invention;

FIG. 4 is a diagram showing another example of an impurity concentration profile of a JTE region in the SiC semiconductor device according to the first preferred embodiment of the present invention; FIGS. 5A and 5B are manufacturing process diagrams of the SiC semiconductor device according to the first preferred embodiment of the present invention;

FIGS. 6A and 6B are manufacturing process diagrams of the SiC semiconductor device according to the first preferred embodiment of the present invention;

FIGS. 9A and 9B are manufacturing process diagrams of the SiC semiconductor device according to the first preferred embodiment of the present invention;

FIGS. 10A and 10B are manufacturing process diagrams of the SiC semiconductor device according to the first preferred embodiment of the present invention;

FIG. 11 is a diagram illustrating a relation between the amount of etching of the JTE region surface and the withstand voltage value of SiC semiconductor devices;

FIGS. 12A and 12B are cross-sectional views of an SiC semiconductor device in which the damage layer in the JTE region surface is removed by dry etching;

DESCRIPTION OF THE PREFERRED EMBODIMENTS

<First Preferred Embodiment>

Figure 1A:
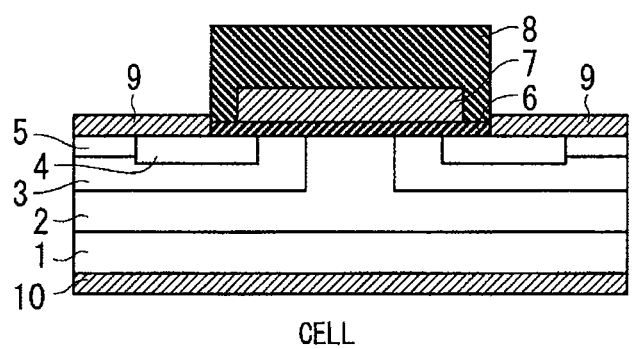
FIGS. 1A and 1B are cross-sectional views illustrating the structure of an SiC semiconductor device according to a first preferred embodiment of the present invention.
Figure 1B:
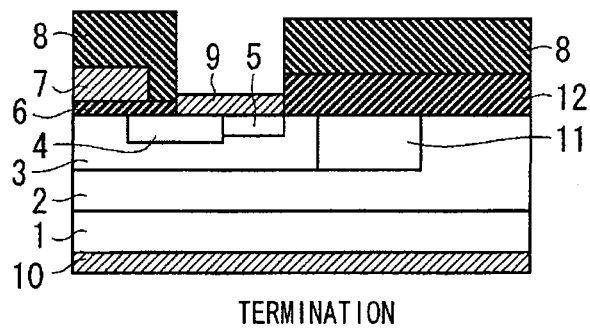

FIGS. 1A and 1B are cross-sectional views illustrating the structure of a MOSFET as an SiC semiconductor device according to a first preferred embodiment of the present invention. FIG. 1A shows a cell of the MOSFET and FIG. 1B shows a termination of the MOSFET. That is, in the MOSFET chip, a plurality of cells having the structure shown in FIG. 1A are arranged in parallel, and the outside of the outermost cell has the structure of FIG. 1B.

As shown in FIG. 1A, the MOSFET cell is formed with an epitaxial substrate including an $n^+$ type SiC substrate 1 and an $n^-$ type epitaxial layer 2 grown thereon. The $n^+$ type SiC substrate 1 and then type epitaxial layer 2 function as a drain contact layer and a drift layer of the MOSFET, respectively.

In the MOSFET cell, p type wells 3 as base regions are formed in upper parts of the $N^-$ type epitaxial layer 2, and n type source regions 4 are formed in their surface portions. On the $n^-$ type epitaxial layer 2, a gate insulating film 6 of a thermal oxide film is formed over the pair of n type source regions 4 and the p type wells 3, and a polysilicon gate electrode 7, for example, is formed thereon.

An interlayer insulating film 8 is formed on the gate electrode 7. The interlayer insulating film 8 is removed above part of the n type source regions 4 and the p type wells 3 (where the gate electrode 7 is absent), and source electrodes 9 in connection with the n type source regions 4 and the p type wells 3 are formed in those parts. P type contact regions 5 having higher impurity concentration than other parts are formed at the connections between the p type wells 3 and the source electrodes 9. A drain electrode 10 is formed on the back of the $n^+$ type SiC substrate 1.

On the other hand, at the termination, as shown in FIG. 1B, a p type JTE region 11 that is an impurity implantation region (termination region) having a lower impurity concentration than the p type well 3 is formed adjacent to the outside of the p type well 3 of the outermost MOSFET cell. A field oxide film 12 is formed on the upper surface of the n type epitaxial layer 2 including the upper surface of the JTE region 11.

As a comparative example with the present invention, FIG. 2 shows an impurity concentration profile of a JTE region in a conventional SiC semiconductor device. As mentioned above, in the conventional JTE region forming method, the impurity ion implantation is carried out in a plurality of stages while varying the implant energy (implant depth) in order to form a Box type impurity concentration profile in the JTE region (the broken line in FIG. 2). FIG. 2 shows the impurity concentration distributions as separate graphs for individual steps (the impurity is Al).

On the other hand, FIGS. 3 and 4 show impurity concentration profiles of JTE regions of the SiC semiconductor devices of this preferred embodiment. In this preferred embodiment, the JTE region is formed by one step of ion implantation (ion implantation in which the kind of the impurity and the implant energy are fixed). FIG. 3 shows an impurity concentration profile of a JTE region formed by one step of ion implantation in which impurity is Al and the implant energy is 350 keV, and FIG. 4 shows an impurity concentration profile of a JTE region formed by one step of ion implantation in which the impurity is Al and the implant energy is 500 keV. As can be seen from FIGS. 3 and 4, the impurity concentration peak is in one position in one step of ion implantation.

Now, a MOSFET manufacturing method according to this preferred embodiment will be described. FIGS. 5A to 10A and 5B to 10B are the process diagrams, and FIGS. 5A to 10A show a cell of the MOSFET, and FIGS. 5B to 10B show a termination of the MOSFET.

First, the epitaxial substrate is prepared in which the $n^-$ type epitaxial layer is grown on the $n^+$ type SiC substrate 1. Selective ion implantations are applied onto the upper part of then type epitaxial layer 2 to form the p type wells 3, n type source regions 4, and p type contact regions 5.

Then, on the $n^-$ type epitaxial layer 2, a resist 21 opening outside of the p type well 3 of the outermost MOSFET is formed, and the JTE region 11 is formed by ion implantation using it as a mask (FIGS. 6A and 6B). As mentioned above, in this preferred embodiment, the JTE region 11 is formed by one step of ion implantation. Here, the JTE region 11 is formed after the formation of the p type wells 3, n type source regions 4, and the p type contact regions 5, but they can be formed in an arbitrary order.

Figure 7A:
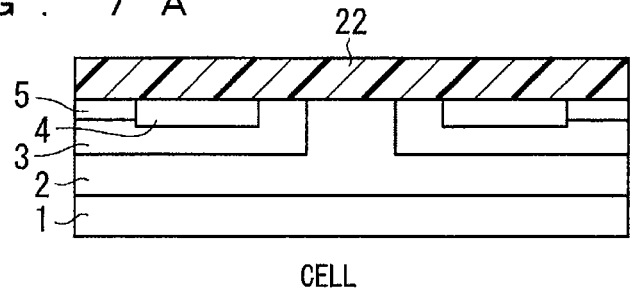
FIGS. 7A and 7B are manufacturing process diagrams of the SiC semiconductor device according to the first preferred embodiment of the present invention.
Figure 7B:
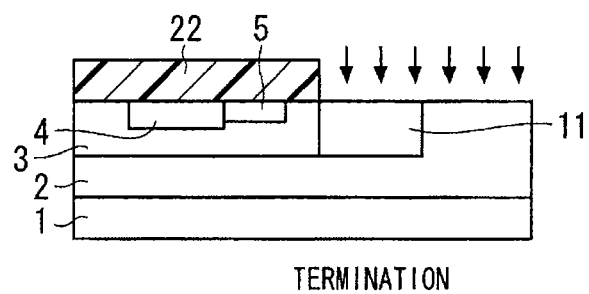

Next, a thermal treatment (activation annealing) is carried out to activate the implanted impurities. Then, a resist 22 opening in a region including the JTE region 11 is formed, and by using it as a mask, the damage layer formed in the surface of the JTE region 11 during the activation annealing is removed by sacrificial oxidation (wet etching for a preformed sacrificial oxide film) or dry etching (FIGS. 7A and 7B). This damage layer removal can be applied not only to the JTE region 11 but also to other regions as long as it does not influence the characteristics of the MOSFET. For example, in FIGS. 7A and 7B, the entire region outside of the JTE region 11 is etched. Especially, the amount of etching of sacrificial oxidation is very small and it hardly influences characteristics of the MOSFET, and so it may be applied to the entire surface of the $n^-$ epitaxial layer 2.

Figure 8A:
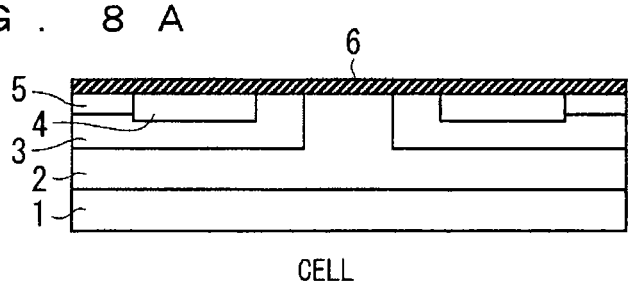
FIGS. 8A and 8B are manufacturing process diagrams of the SiC semiconductor device according to the first preferred embodiment of the present invention.
Figure 8B:
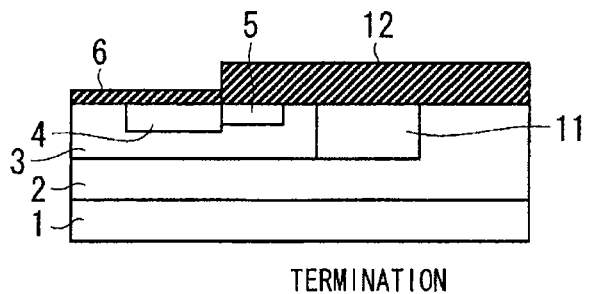

Next, on the $n^-$ epitaxial layer 2, the field oxide film 12 and the gate insulating film 6 are formed (FIGS. 8A and 8B). Then, by photolithography, the gate electrode 7 is formed on the gate insulating film 6 and the interlayer insulating film 8 is formed thereon (FIGS. 9A and 9B).

After that, contact holes are formed in the interlayer insulating film 8 above the n type source regions 4 and the p type contact regions 5 (FIGS. 10A and 10B). Then, the source electrodes 9 are formed in the contact holes and the drain electrode 10 is formed on the lower surface of the $n^+$ SiC substrate 1, so as to obtain the structure of the MOSFET shown in FIG. 1. Though not graphically shown, a pad connecting to the source electrodes 9, a pad connecting to the gate electrode 7, a protection film, etc. are formed to complete the MOSFET semiconductor device.

FIG. 11 is a table illustrating a relation between the amount of etching of the JTE region surface and the withstand voltage values of MOSFETs. In a MOSFET having a JTE region 11 formed by ion implantation of Al, the table of FIG. 11 shows variations of the withstand voltage value in the case where dry etching is not performed to remove the damage layer in the surface of the JTE region 11, and in the cases where the amount of dry etching is from 0.1 μm to 0.3 μm. The designed value of the withstand voltage of this MOSFET is 1500 V.

In the case where dry etching of the surface of the JTE region 11 is not performed (the mount of dry etching 0 μm), sacrificial oxidation only is performed. The amount of etching of sacrificial oxidation is very small (about 10 to 20 nm) as compared with that of dry etching, and so the amount of etching by sacrificial oxidation is neglected.

The table of FIG. 11 compares the case where the JTE region 11 is formed by the conventional multi-stage ion implantation shown in FIG. 2 (Box implantation), the case where the implant energy is fixed at 350 keV as shown in FIG. 3, and the case where the implant energy is fixed at 500 keV.

When the JTE region 11 was formed by Box implantation, obtaining a withstand voltage of 1500 V or more required that the amount of dry etching be in the range of 0.1 μm to 0.2 μm. That is to say, the margin of the amount of etching was 0.1 μm.

On the other hand, when the JTE region 11 was formed by ion implantation in which the implant energy was fixed at 350 keV, a withstand voltage of 1500 V or more was obtained when the amount of dry etching was 0 μm to 0.1 μm. That is to say, the margin of the amount of etching is 0.1 μm as in the Box implantation. When the JTE region 11 was formed by ion implantation in which the implant energy was fixed at 500 keV, a withstand voltage of 1500 V or more was obtained when the amount of dry etching was 0 μm to 0.2 μm. That is to say, the margin of the amount of etching was enlarged to 0.2 μm.

The results will be examined. The impurity concentration profile of the JTE region 11 formed by conventional Box implantation exhibits approximately constant concentration from the surface, so that the sheet impurity concentration (the amount of impurity per unit area, the unit is $cm^{-2}$) of the JTE region 11 after the surface has been etched considerably varies depending on the amount of etching. It is thought that this is the reason why the range (margin) of the amount of etching offering a desired withstand value was small.

On the other hand, with the impurity concentration profile of the JTE region 11 formed by one step of ion implantation, the surface portion exhibits low concentration. Accordingly, the variation of the sheet impurity concentration of the JTE region 11 is small when the surface is etched. It is thought that this is the reason why the variation of the withstand voltage of the MOSFET is small when the amount of etching is 0 μm to 0.1 μm when the implant energy is fixed at 350 keV or 500 keV.

Also, when the implant energy is made larger in one step of ion implantation, the impurity concentration peak is located in a deeper position and the concentration in the surface portion becomes lower, and then the variation of the sheet impurity concentration of the JTE region 11 with respect to the amount of etching becomes smaller. In the JTE region 11 formed with implant energy of 350 keV, as shown in FIG. 3, the impurity concentration exceeds one-tenth of the peak concentration at the position of depth of about 0.21 μm, while in the case of implant energy of 500 keV, as shown in FIG. 4, the impurity concentration is not more than one-tenth of the peak concentration even at the position of depth of about 0.2 to 0.3 μm. It is thought that this is the reason why the margin of the amount of etching is enlarged in the case of implant energy of 500 keV than in the case of 350 keV.

More attention should be given to the fact that, in the case of Box implantation, the desired withstand voltage could not be obtained without dry etching, but in the case of one step of ion implantation, the desired withstand voltage is obtained without dry etching (only with sacrificial oxidation). It is thought that this is because, in the case of one step of ion implantation, a smaller amount of impurity is introduced into the surface portion of the JTE region 11, and so the damage (crystal defects formed by the ion implantation) in the surface portion is smaller, and so the damage layer is sufficiently removed even with a smaller amount of etching.

In this way, a desired withstand voltage can be obtained without applying dry etching (by applying sacrificial oxidation only) to the surface of the JTE region 11 by setting small the concentration in the surface portion in an impurity concentration profile in the depth direction of the JTE region 11. This effect was obtained especially when the impurity concentration in the surface portion is not more than one-tenth of the peak concentration.

Also, when the implant energy of the ion implantation for forming the JTE region 11 is enlarged and thus the impurity concentration peak is positioned deeper, the margin of the amount of etching can be enlarged than in the case of conventional Box implantation because the variation of the sheet impurity concentration with respect to the amount of etching of the JTE region 11 becomes smaller. This effect was obtained especially when the impurity concentration peak is positioned deeper than 0.35 μm.

When a JTE region is formed by ion-implanting Al as impurity into SiC, the position of the impurity concentration peak can be set deeper than 0.35μm by setting the implant energy at 350 keV or more. In this case, as shown in FIG. 3, the impurity concentration in the surface is not more than one-tenth of the peak concentration, and so the effect that dry etching is not needed is also obtained.

The above-described effect is obtained more remarkably when the impurity concentration peak position in the JTE region 11 is deeper, but the beam current becomes smaller in ion implantation with higher implant energy and productivity is lowered. Also, with MOSFET etc, there is a need to form shallow p type regions to make ohmic contact, and the impurity concentration peak position formed by ion implantation systems used for the formation of conventional MOSFETs is limited to about 0.60 μm (500 keV as Al implant energy). Another ion implantation system may be introduced to form a JTE region 11 with a deeper impurity concentration peak, but it is not preferable because new equipment spending is large and the availability factor of the system is lowered. Accordingly, considering the cost and productivity, the depth of the impurity concentration peak of the JTE region 11 is preferably in the range of 0.35 μm to 0.60 μm.

In this preferred embodiment, the JTE region is formed by one step of ion implantation. However, in the impurity concentration profile in the depth direction in the JTE region 11, the JET region 11 may be formed by multiple steps of ion implantation as long as the depth the shallowest peak is deeper than 0.35 μm and the concentration in the surface portion of the JTE region 11 is not more than one-tenth of the peak in the shallowest position (there may be a plurality of impurity concentration peaks). The effects described above are obtained also in such a case.

As to the impurity for forming the p type JTE region 11, it is preferable to use Al as in the examples above. B is also used as p type impurity, but B is easier to diffuse than Al. Accordingly, it diffuses to the surface portion of the JTE region 11 during activation annealing, and it is difficult to control the concentration in the surface portion properly small (not more than one-tenth of the concentration peak).

As described above, the present invention offers the effect that the margin of the amount of etching of the surface of the JTE region 11 becomes large, and this is effective especially when dry etching is performed in which the amount of etching is relatively large. However, when the JTE region 11 is selectively dry-etched, a step height forms in the vicinity of the JTE region 11. For example, when the resist 22 is formed as shown in FIGS. 7A and 7B and dry etching is carried out using it as a mask, a step height forms as shown in FIGS. 12A and 12B on the surface in the vicinity of the JTE region 11 (FIG. 12A illustrates the cell of the MOSFET, and FIG. 12B illustrates the termination thereof). When there is a step height in the vicinity of the JTE region 11, electric field concentration occurs in the vicinity of the step height when a voltage is applied to the semiconductor device (MOSFET) and then the withstand voltage may be lowered. Also, a high electric field may transiently occur at the step height at the time of switching operation.

Accordingly, in the present invention, it is preferable to perform only the sacrificial oxidation without selective dry etching in order to remove the damage layer in the surface of the JTE region 11. This prevents the formation of a step height in the vicinity of the JTE region 11. That is, the surface near the JTE region 11 is formed flat. This suppresses the generation of electric field concentration and a desired withstand voltage is more certainly obtained.

The description above has illustrated a MOSFET as a semiconductor device in which a JTE region is provided, but the present invention is widely applicable to SiC semiconductor devices having JTE regions as termination structures.

<Second Preferred Embodiment>

The field limiting ring (FLR) structure is known as the termination structure other than JTE. The FLR is an impurity implantation region that can be formed by an ion implantation step similar to that for the JTE region, and the present invention is applicable thereto. A second preferred embodiment describes the structure in which the present invention is applied to the FLR.

Figure 13:
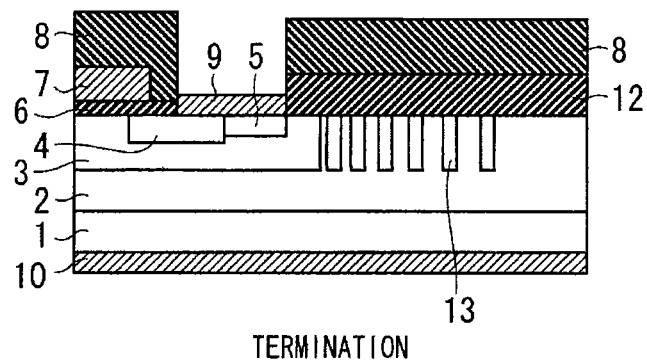
FIG. 13 is a cross-sectional view illustrating the structure of an SiC semiconductor device according to a second preferred embodiment of the present invention.

FIG. 13 is a cross-sectional view showing the structure of the termination of a MOSFET being an SiC semiconductor device according to the second preferred embodiment of the present invention. The cell of the MOSFET is similar to that of the first preferred embodiment (FIG. 1A) of the first preferred embodiment, which is not graphically shown.

As shown in FIG. 13, at the termination of the MOSFET according to this preferred embodiment, a plurality of p type FLRs 13 as impurity implantation regions (termination regions) are provided outside of the p type well 3 of the outermost cell. The impurity concentration profile of each of the FLRs 13 in a depth direction is similar to that of the JTE region 11 according to the first preferred embodiment. That is, in the impurity concentration profile of the FLR 13 in the depth direction, the depth of the shallowest peak is deeper than 0.35 μm and the concentration in the surface portion is not more than one-tenth of the peak in the shallowest position.

Figure 14:
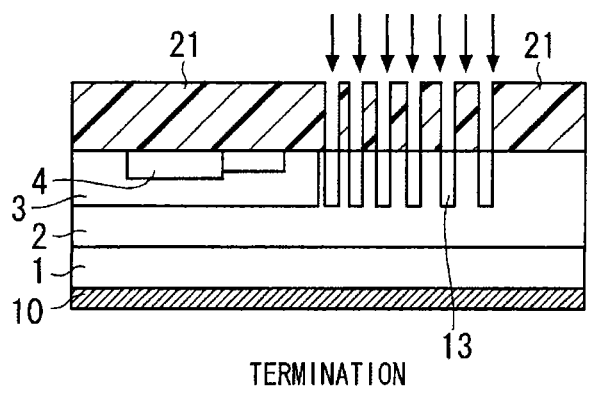
FIGS. 14 and 15 are diagrams for describing an SiC semiconductor device manufacturing method according to the second preferred embodiment of the present invention.

The FLRs 13 can be formed by a technique similar to that for the JTE region 11 according to the first preferred embodiment. Specifically, it suffices that in the ion implantation step described with reference to FIGS. 6A and 6B in the first embodiment, the shape of the resist 21 used as a mask has a pattern such that the formation region of the FLRs 13 are upwardly open as shown in FIG. 14. The other steps may be similar to those of the first preferred embodiment.

According to the FLR 13 of this preferred embodiment, a similar effect to that of the JTE region 11 according to the first preferred embodiment can be obtained. That is, the margin of the amount of etching for removing a damage layer formed in the surface of the FLR 13 due to activation annealing for the FLR 13 is enlarged. Also in this preferred embodiment, only sacrificial oxidation is preferably performed for removing a damage layer in the surface of the FLR 13 so as to prevent the formation of a step height in the vicinity of the FLR 13.

Figure 15:
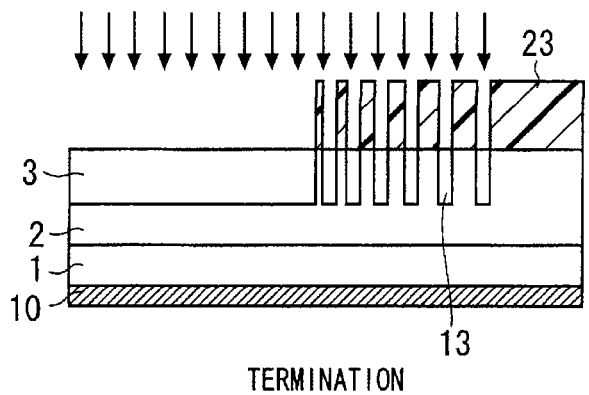

In this case, the JTE region 11 needs to have lower impurity concentration than the p type well 3, where the FLR 13 serves its function even in a case of having the same impurity concentration as that of the p type well 3. In the case where the FLR 13 has the same impurity concentration as that of the p type well 3, the p type well 3 and the FLR 13 can be formed in the same step. That is, it suffices that in the ion implantation step of forming the p type well 3, the shape of a resist 23 used as a mask has a pattern such that the formation regions of the p type well 3 and the FLRs 13 are upwardly open as shown in FIG. 15. This eliminates the need to independently perform the step of forming a termination region (step of FIGS. 6A and 6B in the first preferred embodiment), and thus the second preferred embodiment has fewer manufacturing steps compared with the first preferred embodiment and contributes to cost reduction. In this case, the impurity concentration profiles in the depth direction of the p type well 3 and the FLR 13 are identical to each other. That is, in the impurity concentration profiles in the depth direction in the FLR 13 and the p type well 2, the depth the shallowest peak is deeper than 0.35 μm and the concentration in the surface portion is not more than one-tenth of the peak in the shallowest position.

Figure 16:
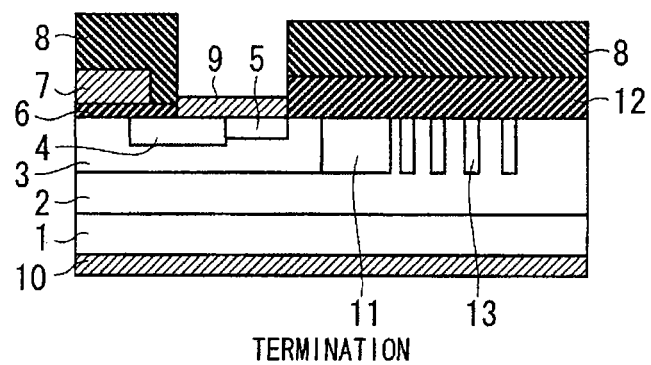
FIG. 16 is a cross-sectional view illustrating the structure of the SiC semiconductor device according to the second preferred embodiment of the present invention.
Figure 17:
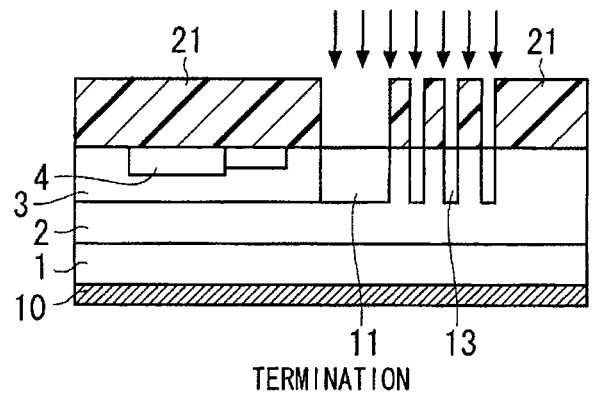
FIG. 17 is a diagram for describing the SiC semiconductor device manufacturing method according to the second preferred embodiment of the present invention.

Alternatively, the JTE region 11 and the FLRs 13 may be used in conjunction with each other. In such a case, as shown in FIG. 16, the JTE region 11 is provided at the outer end of the p type well 3, and the FLRs 13 are further provided outside of the JTE region 11. In the case where the JTE region 11 and the FLRs 13 are used in conjunction with each other, those may have the identical impurity concentration. This enables to form the JTE region 11 and the FLRs 13 in the same step. That is, it suffices that in the ion implantation step (FIGS. 6A and 6B) of forming the JTE region 11, the shape of the resist 21 used as a mask has a pattern such that the formation regions of the JTE region 11 and the FLRs 13 are upwardly open as shown in FIG. 17. In this case, the impurity concentration profiles in the depth direction in the JTE region 11 and the FLRs 13 are identical to each other.

The description above has illustrated a MOSFET as a semiconductor device, but the present invention is widely applicable to an SiC semiconductor device having at least one of the JTE region and FLR as a termination structure.

While the invention has been described in detail, the foregoing description is in all aspects illustrative and not restrictive. It is understood that numerous other modifications and variations can be devised without departing from the scope of the invention.

What is claimed is:

1. A silicon carbide semiconductor device manufacturing method comprising steps of:
   forming a given semiconductor element in a silicon carbide semiconductor layer;
   forming a termination region including at least one of a JTE (Junction Termination Extension) region and an FLR (Field Limiting Ring) by impurity ion implantation in a surface portion of said silicon carbide semiconductor layer in a periphery of said semiconductor element;
   performing activation annealing for said termination region; and after said activation annealing, removing a surface of said termination region by sacrificial oxidation, wherein said impurity ion implantation is performed at such an implant energy that an impurity concentration peak is in a position deeper than 0.35 µm from a surface of said silicon carbide semiconductor layer.

2. The silicon carbide semiconductor device manufacturing method according to claim 1, wherein, in said ion implantation, a concentration of the impurity introduced in a surface portion of said termination region is not more than one-tenth of the concentration in the portion of the concentration peak.

3. The silicon carbide semiconductor device manufacturing method according to claim 1, wherein, in said ion implantation, a kind of impurity and an implant energy are fixed.

4. The silicon carbide semiconductor device manufacturing method according to claim 1, wherein:
said termination region includes the FLR;
said step of forming a semiconductor element includes the step of forming a well by impurity ion implantation; and
said step of forming a well and said step of forming an FLR are performed simultaneously.

5. The silicon carbide semiconductor device manufacturing method according to claim 1, wherein:
said termination region includes the JTE region and the FLR; and
in said step of forming a termination region, said JTE and said FLR are formed simultaneously.

6. The silicon carbide semiconductor device manufacturing method according to claim 1, wherein said impurity is A1.

7. The silicon carbide semiconductor device manufacturing method according to claim 6, wherein the implant energy of said ion implantation is not less than 350 keV.

8. The silicon carbide semiconductor device manufacturing method according to claim 1, wherein the surface of said termination region is formed flat.

9. A silicon carbide semiconductor device manufacturing method comprising steps of:
forming a given semiconductor element in a silicon carbide semiconductor layer;
forming a termination region including at least one of a JTE (Junction Termination Extension) region and an FLR (Field Limiting Ring) by impurity ion implantation in a surface portion of said silicon carbide semiconductor layer in a periphery of said semiconductor element;
performing activation annealing for said termination region; and
after said activation annealing, removing a surface of said termination region by sacrificial oxidation,
wherein said impurity ion implantation is performed to form a single concentration peak of which a concentration of the impurity introduced in a surface portion of said termination region is not more than one-tenth of the concentration in the portion of concentration peak.

* * * * *